(12) United States Patent
Templeton et al.

(10) Patent No.: US 6,269,322 B1
(45) Date of Patent: Jul. 31, 2001

(54) SYSTEM AND METHOD FOR WAFER ALIGNMENT WHICH MITIGATES EFFECTS OF RETICLE ROTATION AND MAGNIFICATION ON OVERLAY

(75) Inventors: Michael K. Templeton, Atherton; Bharath Rangarajan; Kathleen R. Early, both of Santa Clara; Terry Manchester, Los Gatos, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/266,361

(22) Filed: Mar. 11, 1999

(51) Int. Cl.⁷ .................... G03B 27/42; G03F 9/00
(52) U.S. Cl. ............... 702/150; 702/155; 355/53; 356/401; 430/22
(58) Field of Search ...................... 356/399, 401, 356/51; 430/22, 312, 945; 250/548; 355/53, 77, 125; 702/150, 155

(56) References Cited

U.S. PATENT DOCUMENTS

| | | |
|---|---|---|
| 4,662,754 | 5/1987 | Mayer . |
| 4,780,617 | 10/1988 | Umatate et al. . |
| 5,250,983 * | 10/1993 | Yamaura ................ 355/125 |
| 5,329,334 * | 7/1994 | Yim et al. ................ 355/53 |
| 5,627,624 * | 5/1997 | Yim et al. ................ 355/53 |
| 5,648,854 | 7/1997 | McCoy et al. . |
| 5,733,711 | 3/1998 | Juengling . |
| 5,792,580 | 8/1998 | Tomimatu . |
| 5,852,497 | 12/1998 | Pramanik et al. . |

OTHER PUBLICATIONS

*ASM Lithography —Applications Bulletin*; "PAS 5500 Global Alignment Strategies"; Nov. 1, 1996; pp. 1–34.
Patent abstracts of Japan, vol. 1998, No. 06, Apr. 30, 1998 & JP 10 050601 A (NIKON CORP), Feb. 20, 1998 abstract, figures.
International Search Report for International application No. PCT/US 00/03679.

* cited by examiner

*Primary Examiner*—Kamini Shah
(74) *Attorney, Agent, or Firm*—Amin & Turocy, LLP

(57) ABSTRACT

The present invention relates to wafer alignment. A reticle is employed which includes, a design and first and second alignment marks. The second alignment mark is symmetric to the first alignment mark such that a reticle center point is a midpoint of the first and second alignment marks. The first alignment mark is printed on a surface layer of the wafer. The second alignment mark is printed on the surface layer at an offset from the first alignment mark. A virtual alignment mark is determined, the virtual alignment mark being a midpoint of the printed first and second alignment marks. The virtual alignment mark is employed to facilitate aligning the wafer. The symmetric relationship between the first and second alignment mark results in the negation of print errors of the marks due to reticle rotation and/or lens magnification with respect to the virtual alignment mark. The employment of the virtual alignment mark in wafer alignment substantially facilitates mitigation of overlay error.

20 Claims, 14 Drawing Sheets

SYSTEM AND METHOD FOR WAFER ALIGNMENT WHICH MITIGATES EFFECTS OF RETICLE ROTATION AND MAGNIFICATION ON OVERLAY

TECHNICAL FIELD

The present invention generally relates to semiconductor processing, and in particular to a system and method for wafer alignment which mitigates effects of reticle rotation and magnification on overlay.

BACKGROUND OF THE INVENTION

The tendency of semiconductor devices such as integrated circuits (IC) and large scale integrated circuits (LSIC) toward minuteness has rapidly progressed, and higher accuracy has been required of apparatuses for manufacturing such semiconductor devices. In particular, such requirements are demanded from exposure devices in which a circuit pattern of a mask or a reticle is superposedly transferred onto a circuit pattern formed on a semiconductor wafer. It is desired that the circuit pattern of the mask and the circuit pattern of the wafer be superposed one upon the other, for example, with accuracies of less than 0.1 $\mu$m.

Semiconductor integrated circuits undergo a variety of processing steps during manufacture, such as masking, resist coating, etching, and deposition. In many of these steps, material is overlayed or removed from the existing layer at specific locations in order to form desired elements of the integrated circuit. Proper alignment of the various process layers is important. The shrinking dimensions of modern integrated circuits require increasingly stringent overlay alignment accuracy. If proper alignment tolerances are not achieved, device defects can result.

More particularly, during fabrication of an IC, a wafer lithography system projects a pattern of light onto a photoresist layer of a wafer. The projected light changes properties of exposed portions of the photoresist layer such that a subsequent development process forms a mask from the photoresist layer which exposes or protects different portions of the wafer. The masked wafer is then removed to a reaction chamber where a process such as etching changes the exposed portions of the wafer. Typically, a wafer lithography system forms several masks on a wafer during an IC fabrication process, and the masks must be aligned with each other to form a working IC.

A wafer stepper typically is used to align the wafer during the various process steps. The wafer stepper uses one of a number of commercially available techniques to generate alignment signals which indicate position relative to the wafer. The alignment signals typically are produced by optical measurement of alignment marks placed at specified locations on the wafer. A reticle is used to place the appropriate marks on a particular wafer process layer such that the marks can be readily identified by the wafer stepper in subsequent processing steps. The reticle includes a pattern which can be etched into the wafer using optical photolithography. Commonly used alignment mark techniques include Laser Step Alignment (LSA), Field Image Alignment (FIA), Laser Interferometric Alignment (LIA), Global Alignment Mark (GAM), and Global Alignment Mark Laser Step Alignment (GAMLSA). In a step-and-repeat type apparatus, the wafer is moved in steps by predetermined distances. For example, the wafer typically is placed on a two-dimensionally moveable stage and positioned relative to a projected image of a reduction projection type exposure apparatus.

For some types of alignment systems and/or methods, in order to align the wafer large global alignment marks typically are employed. For such systems and/or methods a reticle 30 (FIG. 1) includes a design pattern 32 and an alignment mark 34 outside of the design pattern 32. The alignment mark 34 may be located within the design region 32 but at the expense of sacrificing design area real estate. The design pattern 32 and alignment mark 34 are printed at several predetermined areas of a wafer 40 (FIG. 2). These printed alignment marks are found by a stepper system (not shown) and are employed in wafer alignment, for example, for subsequent processing. However, the reticle 30 may have been in the projection system with a slight rotation and/or the reticle 30 may include rotation errors due to the alignment mark 34 and the design pattern 32 being slightly rotated (for example, as a result of error in the process of manufacturing the reticle). The errors due to rotation of the mark 34 and design pattern 32 become greatly exaggerated as one moves away from the center of the reticle 30 in the case of the aforementioned reticle manufacturing error. Another type of error is lens magnification error wherein the image (alignment mark and/or design pattern) are slightly over-magnified or under-magnified with respect to an intended magnification level. The reticle rotation error and/or lens magnification error results in the alignment mark being printed at locations different from intended.

FIG. 3 illustrates alignment mark print errors (on an exaggerated scale since a shift around 20 nm typically is observed) due to reticle rotation error. The hatched marks 44 represent intended locations for printing the alignment mark 34 on the wafer. The solid marks 48 represent actual print locations of the alignment marks 34. The deviation from intended print location to actual print location results in overlay error since alignment of the wafer 40 is typically premised on the alignment mark 34 actually having been printed at an intended location. As noted above, proper alignment tolerances are required in order to avoid device defects resulting from overlay error. Consequently, there is a need for a system and/or method for mitigating overlay error due to reticle rotation errors and/or lens magnification/demagnification errors.

SUMMARY OF THE INVENTION

The present invention relates to a system and method for mitigating overlay error in the production of semiconductor devices. According to one aspect of the invention, a reticle is provided with a design region and at least first and second alignment marks. The first and second alignment marks are symmetric to each other such that the center of the reticle is also a mid-point of the first and second alignment marks. The first alignment mark is printed on a surface layer of a wafer, and the second alignment mark also is printed on the surface layer of the wafer at a predetermined offset from the first alignment mark. Any reticle rotation error will result in the marks being printed at locations different from the intended locations. The print error will be in proportion to the reticle rotation error. Likewise, any lens magnification/demagnification error in the print process will result in the marks being printed at locations different from intended locations, and the print error will be in proportion to the magnification/demagnification error. However, since the first and second alignment marks on the reticle are symmetric to each other with the reticle center being a midpoint of the first and. second alignment marks, the print error of each mark will be a negative of the other such that a mid-point of the marks as printed will be substantially at the same location as a midpoint of the marks if printed without reticle rotation error and/or magnification/demagnification error.

The midpoint of the marks as printed is used as a reference point for wafer alignment as opposed to the actual marks. Reticle errors and/or lens magnification errors do not manifest in the midpoint of the first and second alignment marks as printed because of the negation effect of the two marks due to their symmetry. A wafer alignment system in accordance with the present invention maps to the midpoint of the first and second marks as printed and employs this midpoint (virtual mark) as a reference point for wafer alignment. This wafer alignment methodology is performed for a plurality of layers and mitigates overlay errors for the respective layers. It is to be appreciated that alternatively the virtual mark is not employed, but the symmetry of the alignment marks alone is utilized in compensationing for reticle rotation error.

Another aspect of the present invention employs a reticle with first and second alignment marks which are symmetric to a center of the reticle. An imaginary line crossing the reticle center and a midpoint of the first and second alignment marks is perpendicular to an imaginary line crossing the centers of the first and second alignment marks. The first and second alignment marks are printed on a surface layer of the wafer in the manner described above, and a wafer alignment system in accordance with the present invention (based on the geometric relation of the first and second alignment marks and the reticle center) determines a virtual alignment mark which is employed as a reference point for wafer alignment. Reticle rotation errors and/or lens magnification errors are not manifested in the virtual alignment mark.

The virtual alignment mark methodology is employed for a plurality of wafer surface layers (e.g., photoresist layers). Each layer being aligned in accordance with the alignment methodology of the present invention will have at least one virtual alignment mark determined for that layer. Reticle rotation errors and/or lens magnification errors relating to the particular layer will be substantially mitigated with respect to the virtual alignment mark(s) for the given layer. Preferably, the alignment marks associated with a particular layer are printed at regions different from regions of other layers where alignment marks are printed. By defining an offset between regions of different layers (which corresponds to determining offsets between virtual alignment marks of different layers), the alignment marks of different layers may be employed as references for alignment of the corresponding wafer layers. If desired, the marks may be printed such that the virtual alignment marks of different layers lie on top of each other.

The present invention mitigates alignment errors due to reticle rotation errors and/or lens magnification errors on a layer by layer basis. As a result, compounding of overlay errors is mitigated as compared to many conventional alignment techniques.

An aspect of the invention relates to a reticle for use in a photolithographic process. The reticle includes a design area; a first alignment mark; and a second alignment mark being symmetric to the first alignment mark such that a reticle center point is a midpoint of the first and second alignment marks.

Another aspect of the present invention relates to a method for aligning a wafer. A reticle is used which includes: a design area; a first alignment mark; and a second alignment mark, the second alignment mark being symmetric to the first alignment mark such that a reticle center point is a midpoint of the first and second alignment marks. The first alignment mark is printed on a first surface layer of the wafer. The second alignment mark is printed on the first surface layer at a predetermined offset from the first alignment mark. A first virtual alignment mark is determined, the first virtual alignment mark being a midpoint of the printed first and second alignment marks. The first virtual alignment mark is used to facilitate aligning the wafer.

Another aspect of the present invention relates to a reticle for use in a photolithographic process. The reticle includes a design area; a first alignment mark; and a second alignment mark, the second alignment mark being symmetric to the first alignment mark with respect to a center point of the reticle. A first imaginary line crosses the first and second alignment marks, and a second imaginary line crosses the reticle center and a midpoint of the first and second alignment marks, the first imaginary line being perpendicular to the second imaginary line.

Still another aspect of the present invention relates to a system for aligning a wafer, comprising: a reticle, including: a design area; a first alignment mark; and a second alignment mark which is symmetric to the first alignment mark with respect to a reticle center point. The system further includes at least one system for locating at least one of the first and second alignment marks as printed on the surface layer of the wafer; and a processor for controlling general operations of the system, the processor determining a first virtual alignment mark, the first virtual alignment mark being a midpoint of the first and second alignment marks as printed on the wafer, the processor employing the first virtual alignment mark to facilitate alignment of the wafer.

Yet another aspect of the invention relates to a system for aligning a wafer, including a reticle which comprises: a design area; a first alignment mark; and a second alignment mark. The system also includes at least one system for locating at least one of the first and second alignment marks as printed on the surface layer of the wafer. The system further includes a processor for controlling general operations of the system, the processor mapping the reticle so as to define locations of the first and second alignment marks with respect to the reticle, the processor also mapping the wafer so as to define intended locations of first and second alignment mark printing, and actual locations of first and second alignment mark as printed, the processor determining the magnitude of reticle rotation error and/or lens magnification error based on the alignment mark mappings.

Another aspect of the present invention relates to a method for aligning a wafer, comprising the steps of: using a reticle, including: a design area; a first alignment mark; and a second alignment mark, the second alignment mark being symmetric to the first alignment mark with respect to a reticle center point. The first alignment mark is printed on a first surface layer of the wafer. The second alignment mark is printed on the first surface layer with the intent of printing the second alignment mark directly over the first alignment mark. A first virtual alignment mark is determined, the first virtual alignment mark being a centroid of an object which represents the combined printed first and second alignment marks. The virtual alignment mark is employed in aligning the wafer.

Another aspect of the present invention relates to a system for aligning a wafer, including: means for printing at least two alignment marks on a surface layer of the wafer, the at least two alignment marks having an associated symmetry such the marks as printed substantially negate reticle rotation error and/or lens magnification error, and means for aligning the wafer using the at least two virtual alignment marks as a reference.

Another aspect of the invention relates to a wafer alignment system including a reticle including at least two alignment marks; means for printing the alignment marks; means for finding the printed alignment marks; means for determining the deviation of the printed alignment marks from intended print locations; and means for modifying the wafer alignment system to compensate for the deviation.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
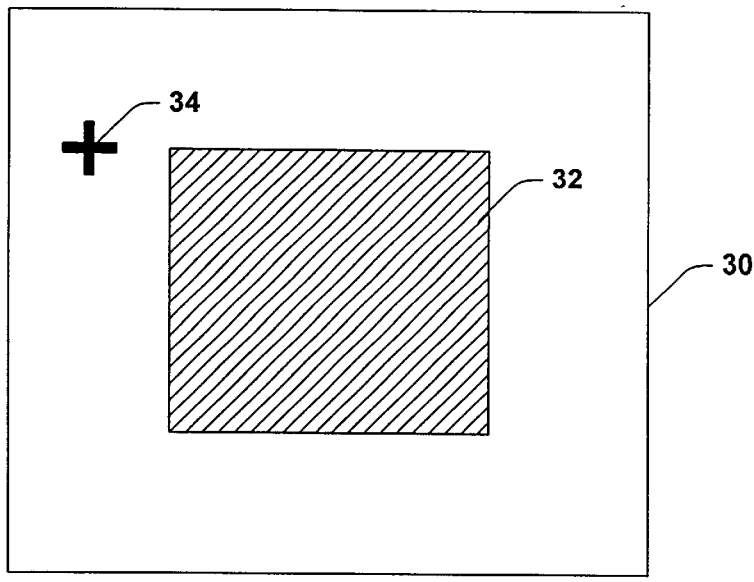
FIG. 1 is schematic illustration of a prior art reticle including one alignment mark.
Figure 2:
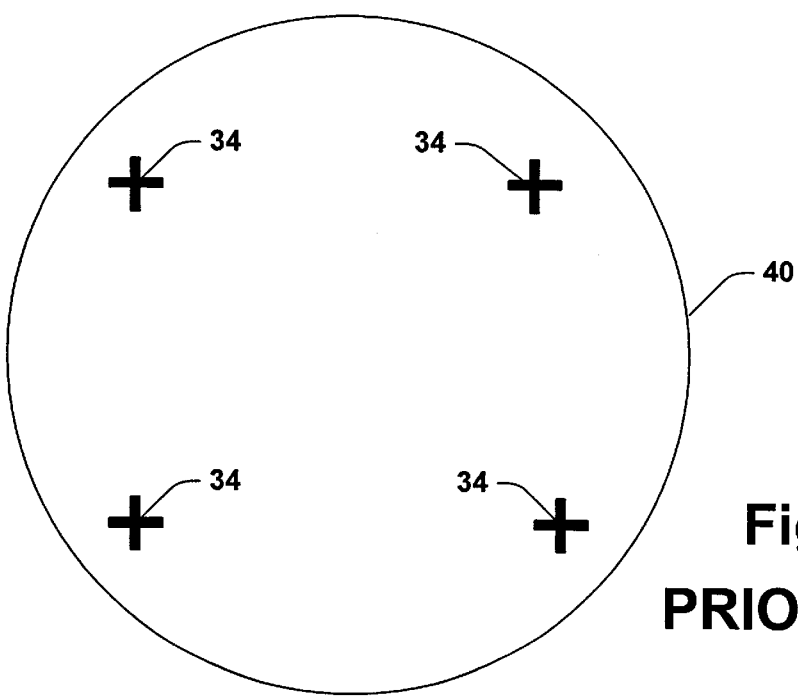
FIG. 2 is a schematic illustration of a wafer having alignment marks printed thereon.
Figure 3:
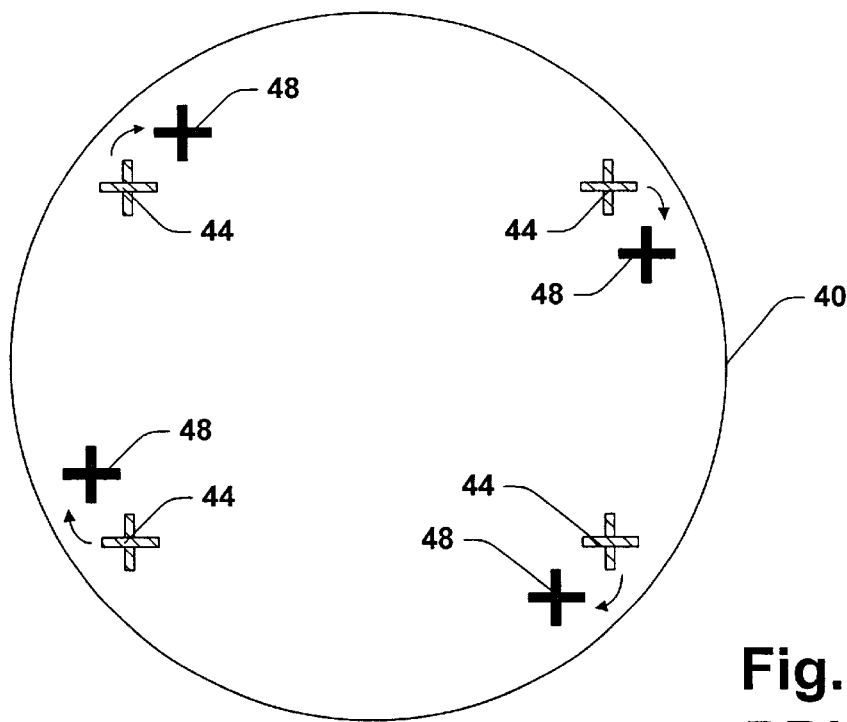
FIG. 3 is a schematic illustration of a wafer having alignment marks printed thereon from the prior art reticle of FIG. 1, wherein reticle rotation resulted in the marks being printed at locations different from intended print locations.

The present invention will now be described with reference to the drawings, wherein like reference numerals are used to refer to like elements throughout.

Figure 4:
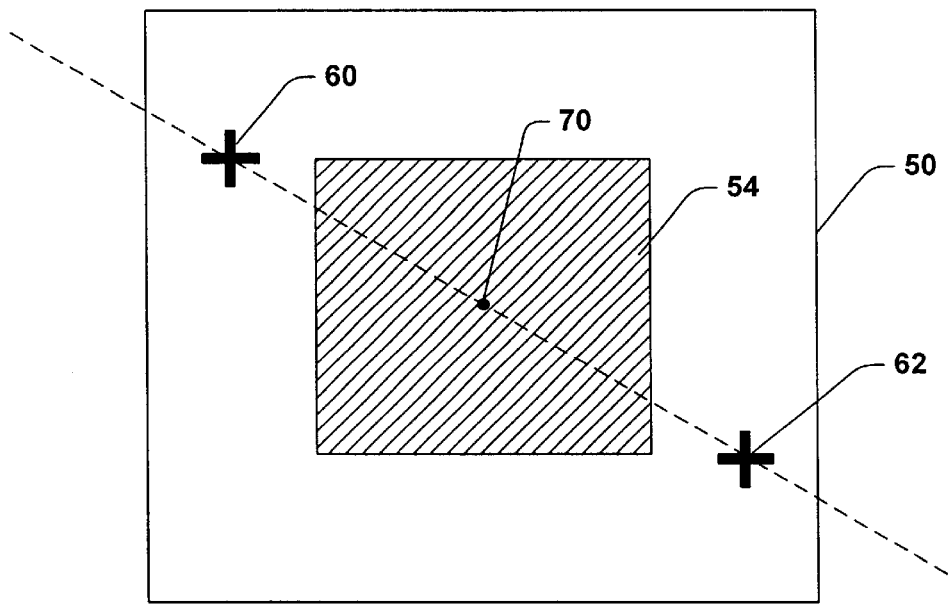
FIG. 4 is a schematic illustration of a reticle having two symmetric alignment marks in accordance with the present invention.

Referring initially to FIG. 4, a representative schematic illustration of a reticle 50 is shown in accordance with the present invention. The reticle 50 includes a design pattern 54 located substantially at a central region of the reticle 50. The design pattern 54 is typically imaged via an exposure source (such as light, x-rays, an electron beam or other electromagnetic energy) passing through the reticle 50 onto the exposure area of a wafer. The exposure source alters regions of a photoresist on the wafer exposed according to the design pattern 54 of the reticle 50. The reticle 50 also includes first and second alignment marks 60 and 62. The alignment marks 60 and 62 are preferably located outside of the design pattern 54 in order to maximize design space utilization. The alignment marks 60 and 62 are employed to facilitate wafer alignment. As seen from FIG. 4, the alignment marks 60 and 62 are symmetric to each other with respect to a center of the reticle 70. In this particular embodiment, the reticle center 70 is a midpoint between the first alignment mark 60 and the second alignment mark 62.

Figure 6A:
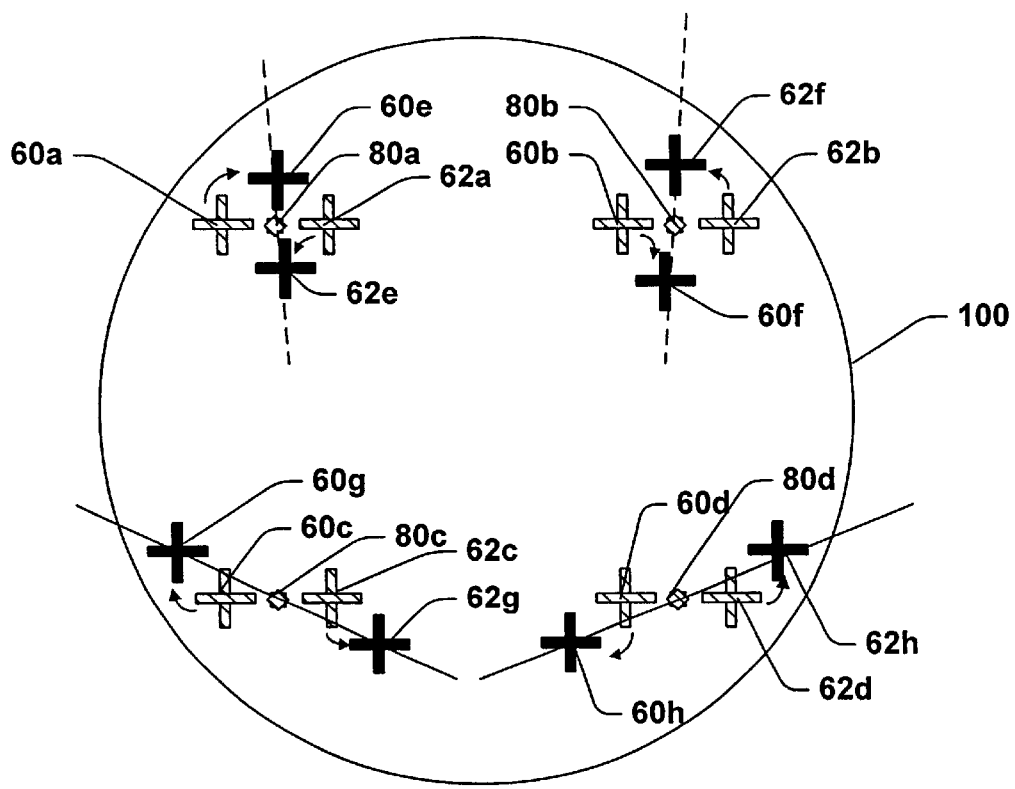
FIG. 6a is a schematic illustration of a wafer surface layer wherein four different reticle rotation/magnification errors result in the alignment marks being printed at locations different from intended locations, and wherein virtual alignment marks are determined in accordance with the present invention.

The symmetrical relationship of the two marks 60 and 62 with respect to the reticle center 70 provides for determining a virtual alignment mark (generally referenced by numeral 80 in FIG. 6a). Reticle rotation errors and/or lens magnification errors which typically manifest in alignment marks being printed at locations on the wafer surface level (a particular photoresist layer) different from desired locations are negated by the symmetry of the alignment marks 60 and 62. Although reticle rotation and/or lens magnification errors manifest in each mark 60 and 62 individually, the errors are negated with respect to the virtual mark 80. By using the virtual alignment mark as a reference point for wafer alignment, overlay errors due to reticle rotation and/or lens magnification/demagnification are substantially mitigated.

Figure 5:
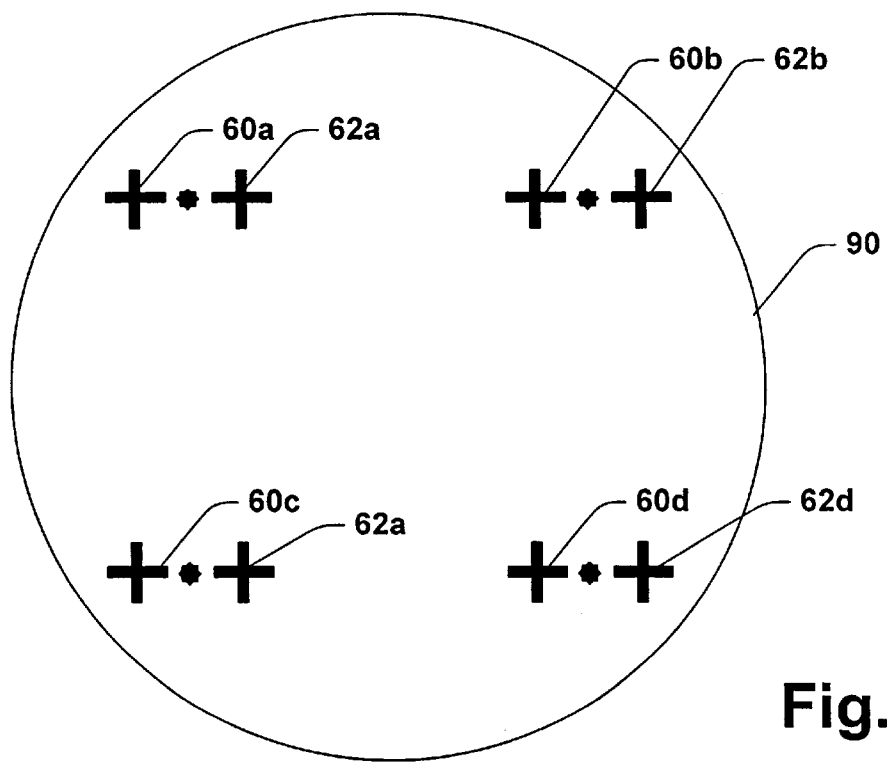
FIG. 5 is a schematic illustration of a wafer surface layer having alignment marks printed at desired locations in accordance with the present invention.

FIG. 5 is a schematic illustration of a wafer 90 having alignment marks 60 and 62 printed thereon in an ideal case where there are no reticle rotation errors and/or lens magnification errors. Each of the alignment marks 60 and 62 are printed on a surface layer of the wafer 90 at four different locations, and the alignment marks 62a, 62b, 62c and 62d (collectively referred to as 62) are printed at a predetermined offset from the alignment marks 60a, 60b, 60c and 60d (collectively referred to as 60), respectively. Since there is no reticle rotation error and/or magnification error, the alignment marks 60 and 62 are printed at locations where intended.

FIG. 6a is a schematic illustration of a wafer 100 having alignment marks 60 and 62 printed thereon in a non-ideal case where various reticle rotation/magnification errors has resulted in the marks being printed at locations different from where intended. The hatched marks 60a, 60b, 60c, 60d, 62a, 62b, 62c and 62d indicate intended print locations of the marks 60 and 62, and the solid marks 60e, 60f, 60g, 60h, 62e, 62f, 62g and 62h (collectively referred to as 60' and 62', respectively) illustrate where the marks 60 and 62 were actually printed. It is to be appreciated that FIG. 6a illustrates several cases of reticle rotation/magnification errors, but typically the reticle is clamped during a single wafer exposure step, and only one case is actually present.

As can be seen, however, a midpoint between the intended print locations 60 and 62 is at substantially the same location as a midpoint of the actual print locations 60' and 62', respectively. The symmetry of the marks 60 and 62 result in the negation of reticle rotation errors when printed with respect to a midpoint (virtual alignment mark) 80 of the printed marks 60' and 62'. As such, the midpoints (virtual alignment marks) 80a, 80b, 80c and 80d (collectively referred to as 80) between the printed marks 60' and 62', respectively, may be employed as reference points for wafer alignment. Since reticle rotation errors and/or lens magnification errors are not manifested in the virtual alignment marks 80, employment of the virtual alignment marks 80 substantially facilitates mitigation of overlay errors due to reticle rotation and/or lens magnification/demagnification.

Still referring to FIG. 6a, the symmetry of the alignment marks 60 and 62 on the reticle 50 affords for negation of the reticle rotation and/or lens magnification errors. As can be seen, alignment mark 60 was intended to be printed at location 60a, however, due to reticle rotation error the mark was printed at location 60e (shifted in the clockwise direction). The corresponding symmetric mark 62 was intended to be printed at 62a, but due to the reticle rotation error was actually printed at location 62e (shifted counterclockwise). Thus, one mark 60 was shifted clockwise in an amount corresponding to the reticle rotation error, and the other mark 62 was shifted counterclockwise in amount equal in magnitude to the clockwise shift of mark 60. As a result, the shifting of each mark negates the other with respect to a midpoint 80a of the printed marks 60e and 62e. Thus, the midpoint 80a provides a point of reference for wafer alignment which is substantially free of errors manifesting from reticle rotation and lens magnification.

Figure 6B:
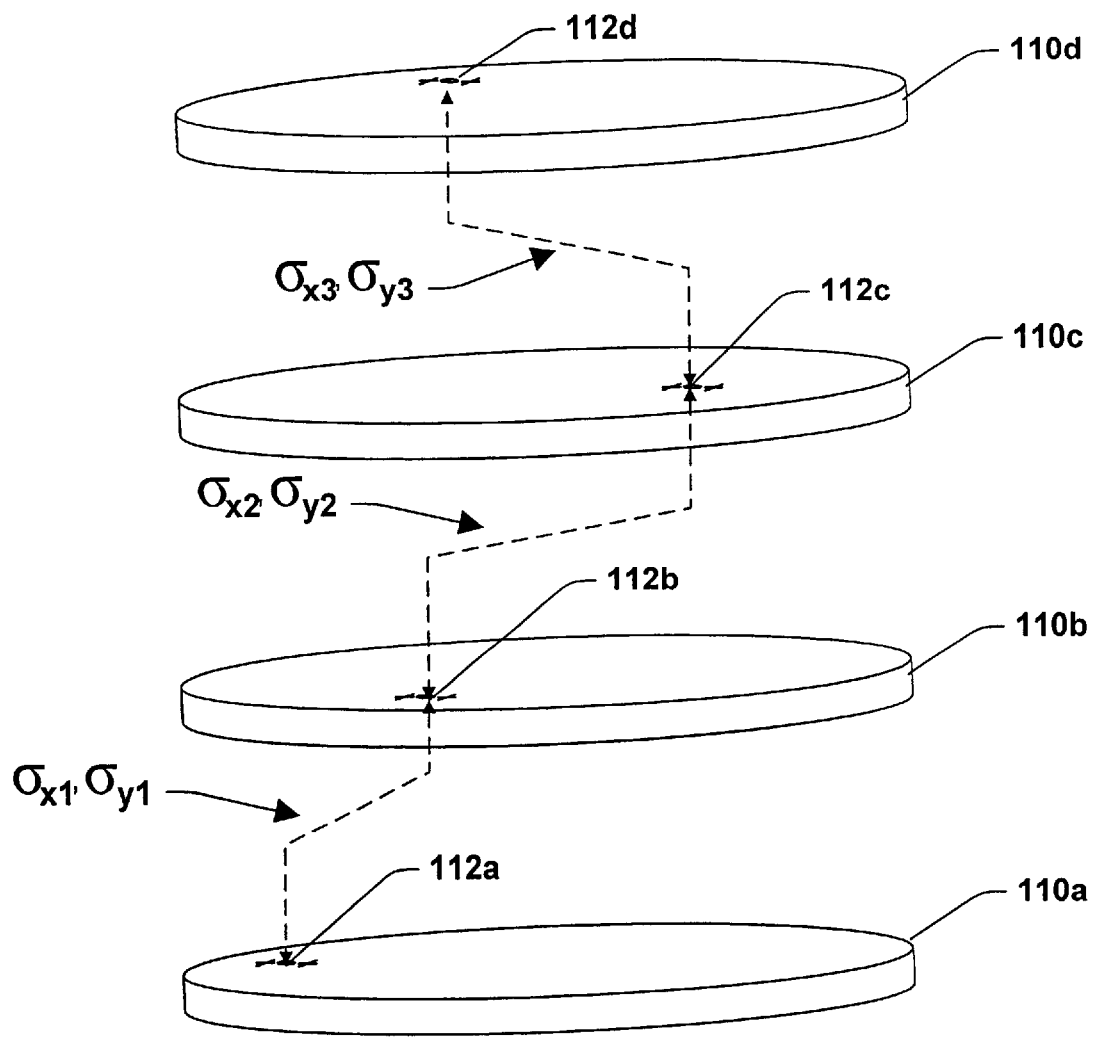
FIG. 6b is an exploded view of different wafer layers with corresponding virtual alignment marks which have been determined with known offsets to each other in accordance with the present invention.

As discussed in greater detail below, the present invention employs the virtual alignment marks 80 as reference points for alignment of the wafer 100. Since the virtual alignment marks 80 are substantially free of shifting errors due to reticle rotation and lens magnification/demagnification errors, the employment of the virtual alignment marks 80 in wafer alignment facilitate mitigation of overlay errors. If desired, the virtual alignment marks can be determined on a layer by layer basis with a known offset between virtual alignment marks of different layers. The known offset allows for coordinating the virtual alignment marks as reference points for alignment of one layer to another layer. Since the virtual alignment marks associated with a given layer are substantially free of location errors due to reticle rotation and/or lens magnification errors associated with patterning the respective layer, the coordination of virtual alignment marks of different layers affords for aligning respective layers such that overlay errors are mitigated. FIG. 6b is an exploded view of different wafer layers 110a, 110b, 110c and 110d with corresponding virtual alignment marks 112a, 112b, 112c and 112d which have been determined with known offsets (($\sigma_{x1}$, $\sigma_{y1}$), ($\sigma_{x2}$, $\sigma_{y2}$) and ($\sigma_{x3}$, $\sigma_{y3}$)) to each other, respectively. As can be appreciated, the known offsets of the virtual alignment marks 112 may be determined based on the known offsets of expected print regions for the alignment marks between layers 110, respectively. It is to be appreciated that although the symmetric alignment marks as discussed herein are shown having same patterns, it is to be appreciated that a first alignment mark of a reticle may have a different pattern than a second alignment mark for ease of differentiating between marks after being printed on the wafer surface. Furthermore, alignment marks may be further differentiated (patternwise) from one reticle to another. Any suitable pattern for an alignment mark may be employed and is intended to fall within the scope of the hereto appended claims.

Figure 7:
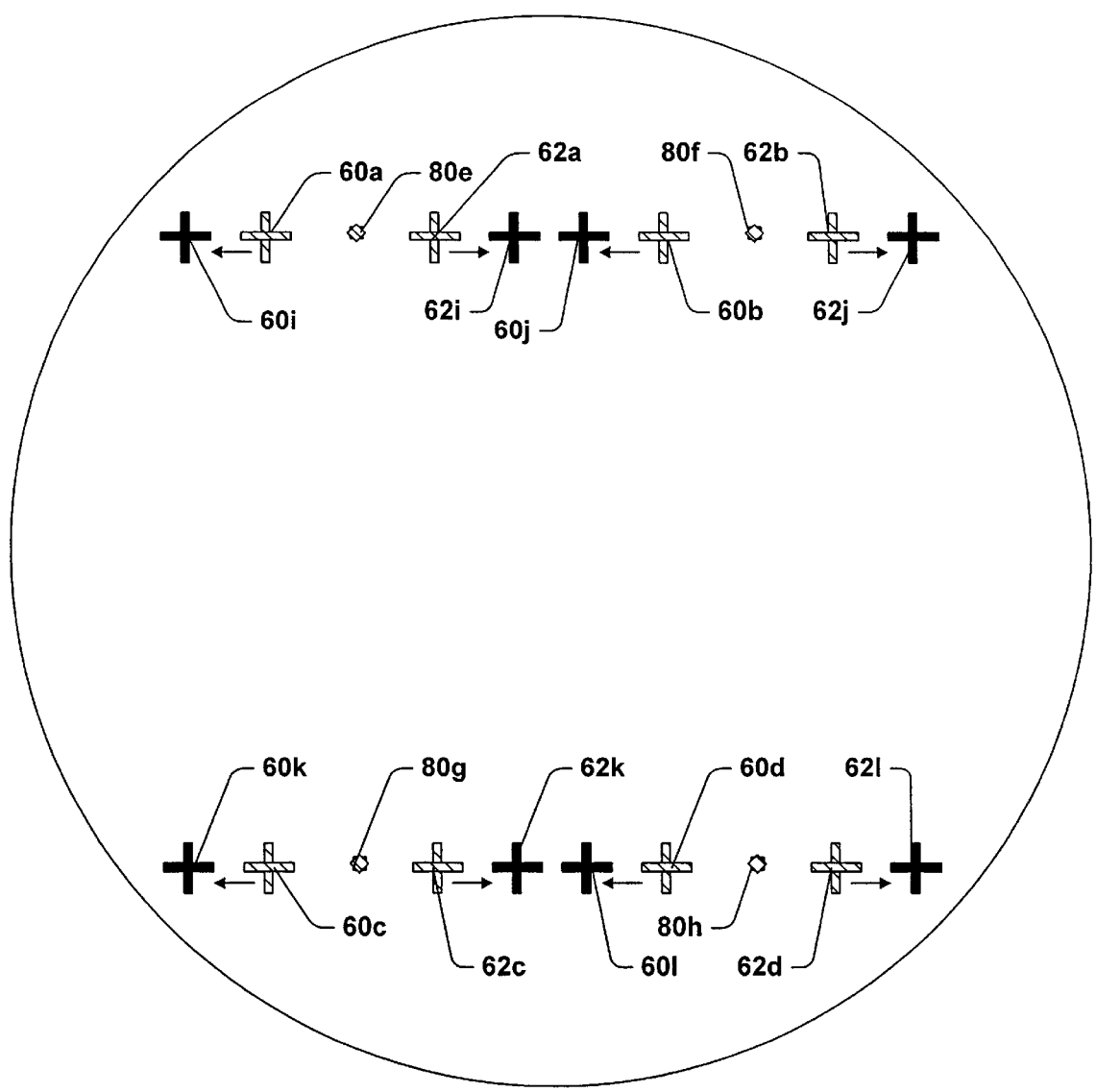
FIG. 7 is a schematic illustration of a wafer surface layer wherein lens magnification error resulted in the alignment marks being printed at locations different from intended locations, and wherein virtual alignment marks are determined in accordance with the present invention.

FIG. 7 illustrates an example wherein lens magnification results in the alignment marks 60 and 62 being printed at locations on the wafer surface layer (e.g., photoresist) different from intended locations. More particularly, the alignment marks 60 and 62 were intended to be printed at locations 60a, 60b, 60c, 60d, 62a, 62b, 62c and 62d, respectively. However, due to lens magnification error, the alignment marks 60 and 62 were actually printed at locations 60i, 60j, 60k, 60l, 62i, 62j, 62k and 62l. As can be seen, the midpoints 80 (80e, 80f, 80g and 80h) of the marks 60 and 62 intended print locations are substantially the same as the midpoints 80 of the actual print locations of the marks. Thus, these midpoints 80, respectively, may be employed as virtual alignment marks for wafer alignment so as to mitigate overlay error due to lens magnification.

Figure 8:
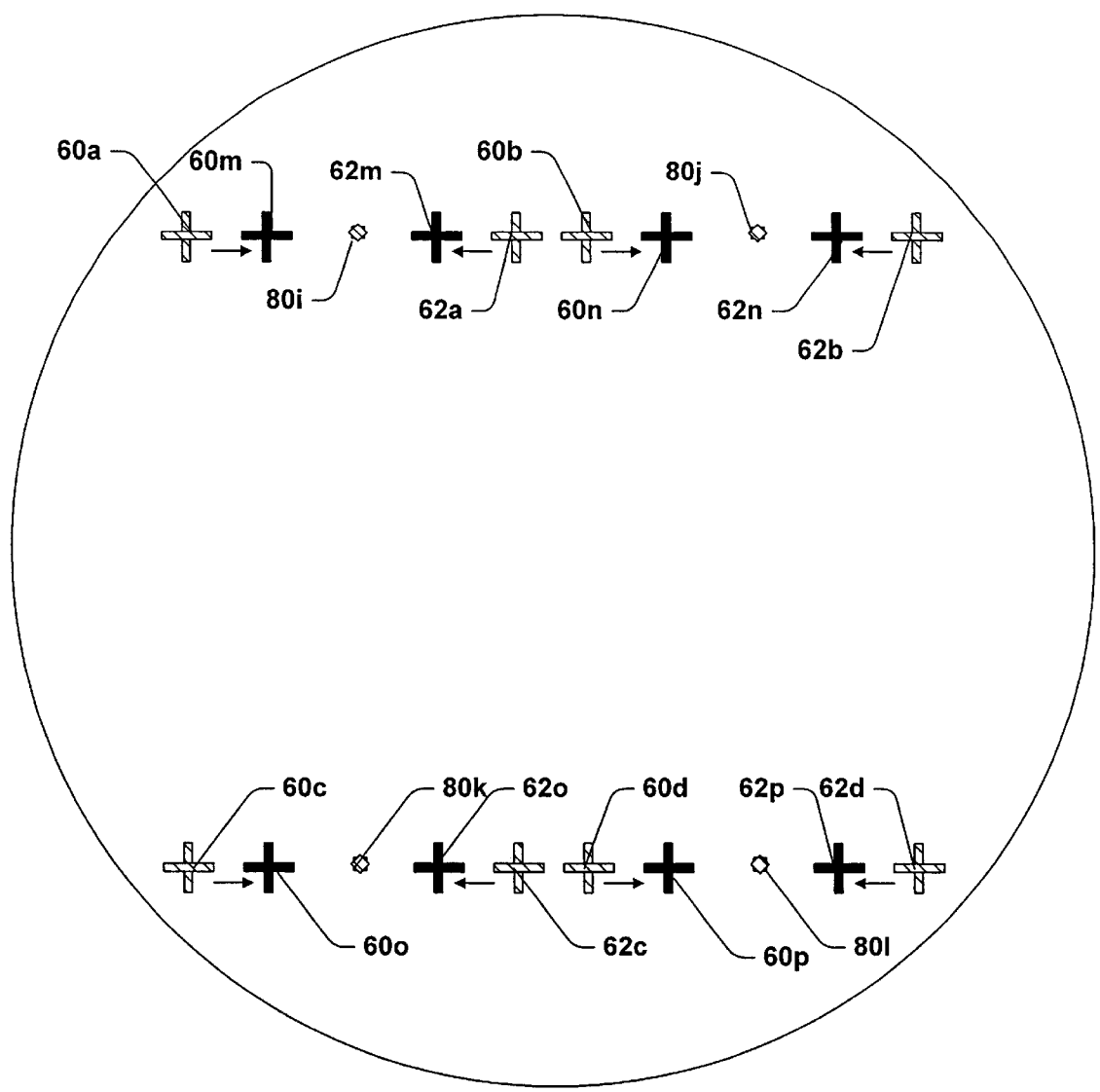
FIG. 8 is a schematic illustration of another wafer surface layer wherein lens magnification error resulted in the alignment marks being printed at locations different from intended locations, and wherein virtual alignment marks are determined in accordance with the present invention.

FIG. 8 illustrates an example wherein lens demagnification results in the alignment marks 60 and 62 being printed at locations on the wafer surface layer (e.g. photoresist) different from intended locations. More particularly, the alignment marks 60 and 62 were intended to be printed at locations 60a, 60b, 60c, 60d, 62a, 62b, 62c and 62d, respectively. However, due to lens magnification error, the alignment marks 60 and 62 were actually printed at locations 60m, 60n, 60o, 60p, 62m, 62n, 62o and 62p. As can be seen, the midpoints 80 (80i, 80j, 80k and 80l) of the marks 60 and 62 intended print locations are substantially the same as the midpoints 80 of the actual print locations of the marks 60 and 62. Thus, these midpoints 80, respectively, may be employed as virtual alignment marks for wafer alignment so as to mitigate overlay error due to reticle rotation and/or lens magnification.

Figure 9:
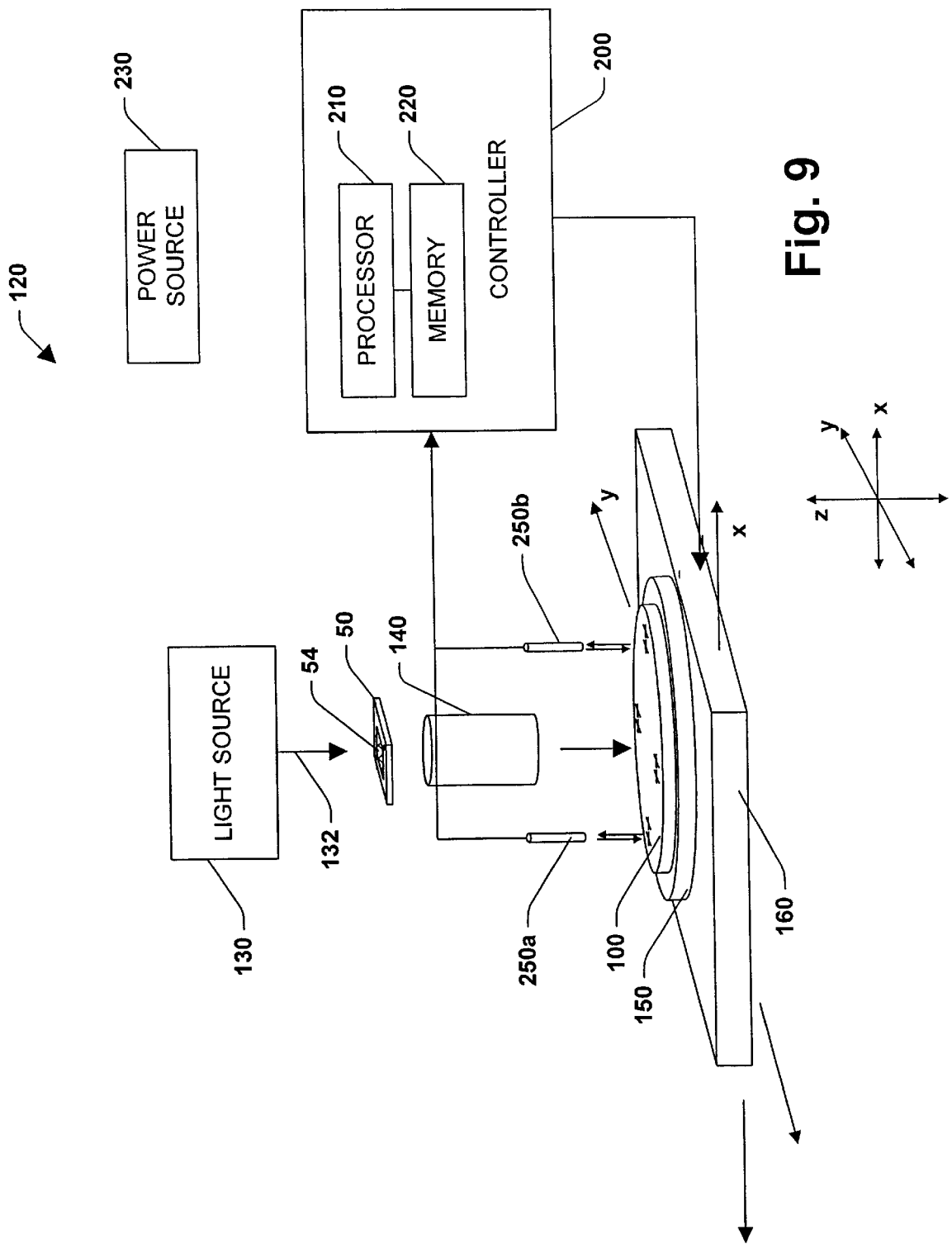
FIG. 9 is a representative schematic illustration of a wafer alignment system in in accordance with the present invention.

FIG. 9 is a representative system 120 for wafer alignment in accordance with the present invention. The system 120 includes the reticle 50 with the design pattern 54. A light source 130 projects light 132 through the reticle 50 to so as to project the design pattern 54 onto the wafer 90. The light 132 from the light source 130 passes through the reticle 50 and through the optical axis of a projection lens system 140. The projection lens system 140 projects the design pattern 54 of the reticle 50 onto the wafer 100 while in most cases substantially reducing the imaged design pattern. It is to be appreciated that reflection-type systems, scanning systems and other suitable systems may be employed in carrying out the present invention.

A wafer holder 150 vacuum-adsorbs the wafer 100 and is provided for slight rotation relative to a stage 160 two-dimensionally moveable in x-direction and y-direction. The stage 160 and wafer holder 150 are controlled by a controller 200. The controller 200 effects rotation of the wafer holder 150 and movement of the stage 160 (via a plurality of motors (not shown)) for wafer alignment and positioning. The controller 200 includes a processor 210 which is programmed to control and operate the various components within the system 120 in order to carry out the various functions described herein. The manner in which the processor 210 can be programmed to carry out the functions relating to the present invention will be readily apparent to those having ordinary skill in the art based on the description provided herein.

A memory 220 which is operatively coupled to the processor 210 is also included in the controller 200 and serves to store program code executed by the processor 210 for carrying out operating functions of the system 120 as described herein. The memory 220 includes read only memory (ROM) and random access memory (RAM). The RAM is the main memory into which the operating system and application programs are loaded. The memory 220 also serves as a storage medium for temporarily storing information such as reticle position, wafer position, reticle coordinate tables, wafer coordinate tables, alignment mark information, printed alignment mark information, virtual alignment mark information, programs for determining virtual alignment mark locations and other data which may be employed in carrying out the present invention. For mass data storage, the memory 210 may include a hard disk drive (e.g., 50 Gigabyte hard drive).

A power supply 230 provides operating power to the system 120. Any suitable power supply (e.g., battery, line power) may be employed to carry out the present invention.

In one specific case, the system 120 further includes off-axis type wafer alignment microscopes 250a and 250b (collectively referred to by reference number 250). The microscopes 250 have optic axes parallel to the optic axis of the projection system 140 and image on the wafer 100 band-like laser light spots (not shown), for example. The band-like laser spots are light of a wavelength which does not activate the photosensitive agent (photoresist) on the wafer 100. Each microscope 250 has a photo-element (not shown) receiving scattered light and diffracted light from the alignment marks printed on the wafer surface (photoresist). The microscopes 250 also include systems for synchronizing and rectifying the photoeletric signal output by the photoelements, respectively, at the vibration period of the light spot(s) and output an alignment signal corresponding to alignment mark deviation relative to the center of vibration of the light spot(s). It is to be appreciated that the wafer alignment mark positioning systems are evolving rapidly and any suitable positioning system (e.g., through the lens system) may be employed to carry out the present invention and is intended to fall within the scope of the hereto appended claims.

The system 120 employs the microscopes 250 to facilitate finding and mapping the locations of the alignment marks 60 and 62 as printed on the surface layer of the wafer 90. Once the alignment mark locations are mapped, the processor 210 can determine the midpoint of respective alignment mark pairs 60, 62 in order to map the virtual alignment mark 80. The processor 210 will employ the virtual alignment mark 80 as a reference for wafer alignment.

Wafer alignment systems are well known in the art, and therefore it is to be appreciated that conventional aspects of the system 120 are described herein at a high level or omitted for sake of brevity. One skilled in the art could readily construct a wafer alignment system in accordance with the present invention based on the teachings herein.

Figure 10:
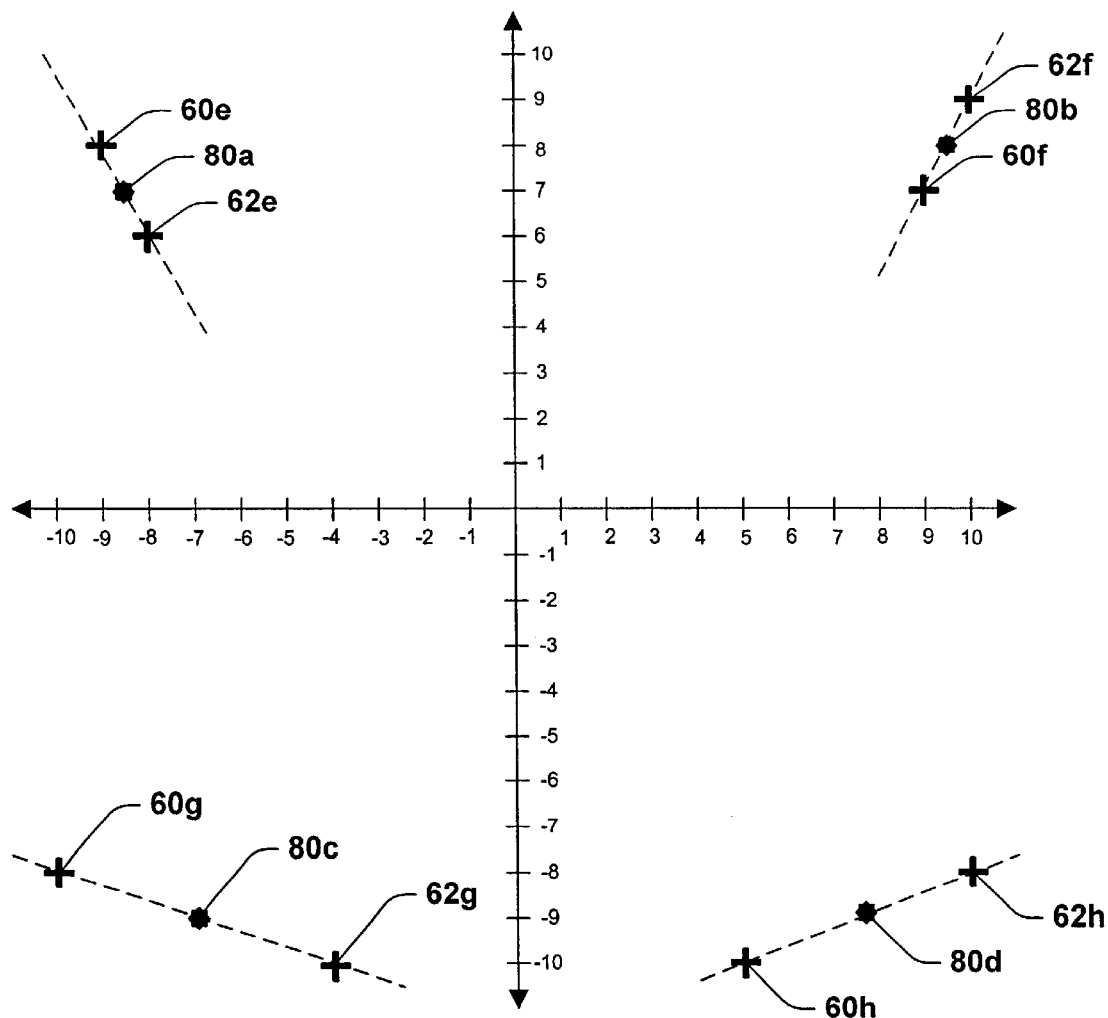
FIG. 10 is a schematic illustration of the printed alignment marks of FIG. 6a mapped to a Cartesian coordinate system in accordance with the present invention.

Turning now to FIG. 10, alignment marks 60e, 60f, 60g, 60h, 62e, 62l, 62g and 62h, and virtual alignment marks 80a, 80b, 80c and 80d (FIG. 6a) are shown mapped onto a Cartesian coordinate system. The various marks are shown mapped by (x,y)coordinates, respectively. The processor 210 can determine the location ($X_{V80}$, $Y_{V80}$) of the virtual alignment marks 80 from the following equation:

$$X_V, Y_V = \frac{X_1 + X_2}{2}, \frac{Y_1 + Y_2}{2}$$

wherein $X_V, Y_V$ are the x,y coordinates for the virtual alignment mark, and ($X_1$, $Y_1$) and ($X_2$, $Y_2$) are coordinates of the alignment marks as printed.

For example, marks 60e and 62e have (x,y) coordinates (−9,8) and (−8,6), respectively. The (x,y) coordinate location for the corresponding virtual alignment mark 80a may be determined from the above equation as follows:

$$X_{V80a}, Y_{V80a} = \frac{-9-8}{2}, \frac{8+6}{2} = (-8.5, 7)$$

which corresponds to the location of the virtual alignment mark 80a as mapped on the Cartesian coordinate system of FIG. 10. It is to be appreciated that any suitable mathematical technique may be employed (e.g., Least Squares technique) to determine the location of the virtual mark.

Figure 11A:
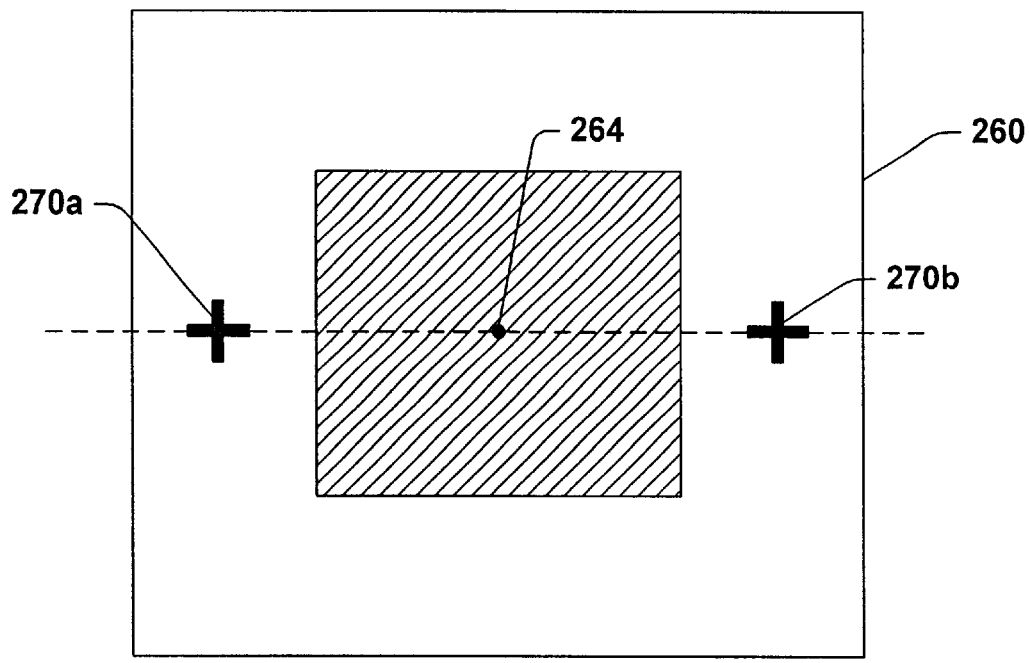
FIG. 11a is a schematic illustration of an alternative embodiment of a reticle with two symmetric alignment marks in accordance with the present invention.
Figure 11B:
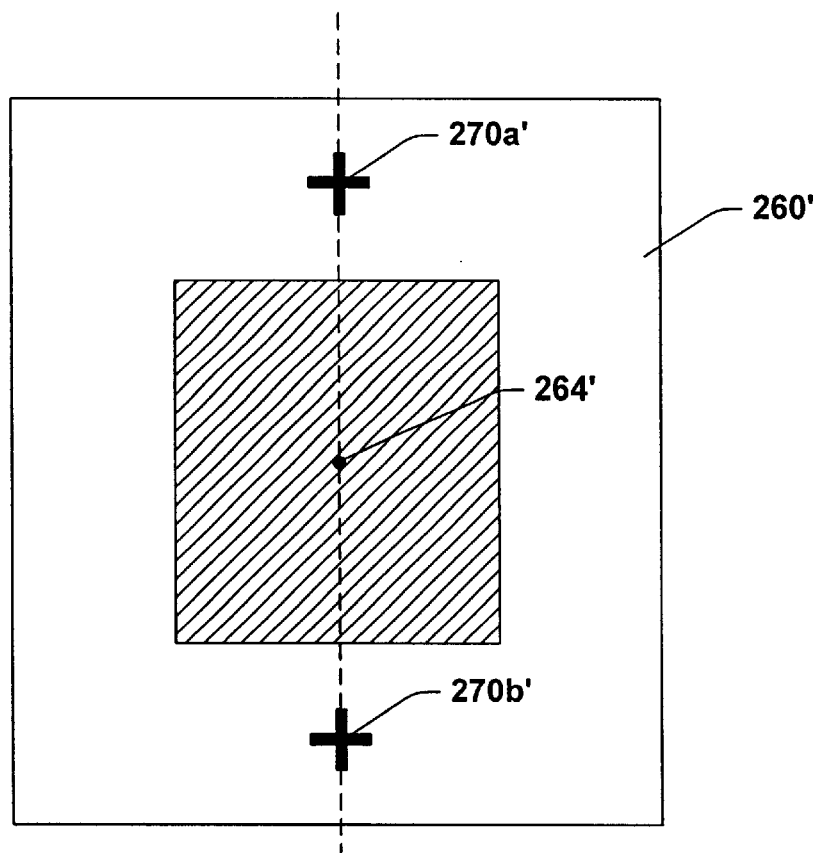
FIG. 11b is a schematic illustration of another alternative embodiment of a reticle with two symmetric alignment marks in accordance with the present invention.

FIG. 11a illustrates another embodiment of reticle 260 in accordance with the present invention wherein a reticle center 264 is a midpoint between alignment marks 270a and 270b. FIG. 11b illustrates another embodiment of a reticle 260' in accordance with the present invention wherein a reticle center 264' is a midpoint between alignment marks 270a' and 270b'.

Figure 11C:
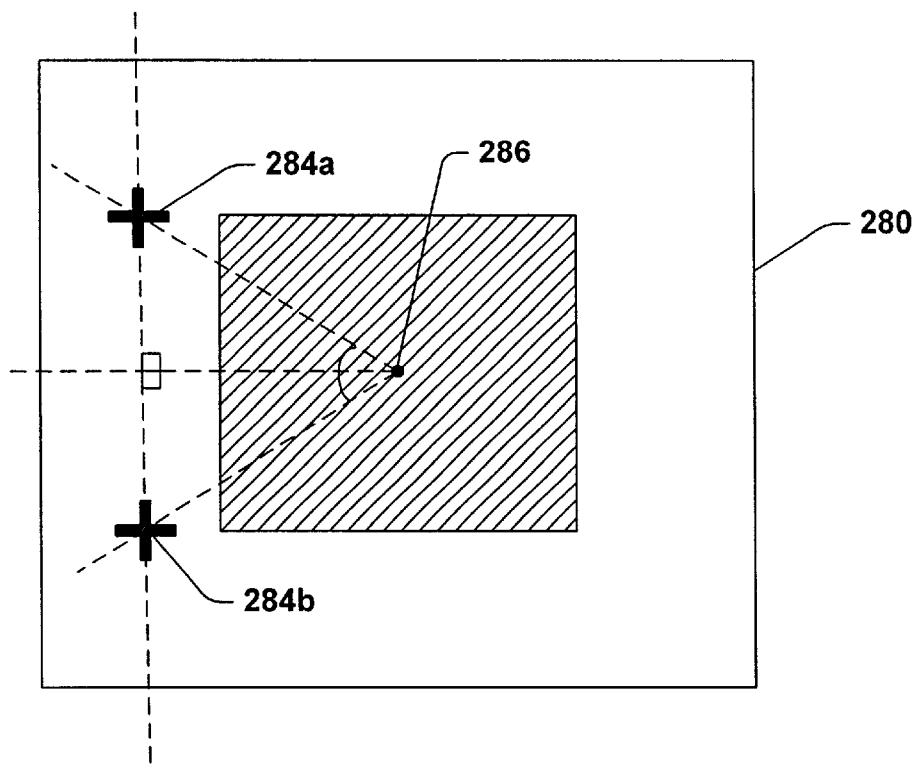
FIG. 11c is a schematic illustration of an yet another embodiment of a reticle with two symmetric alignment marks in accordance with the present invention.
Figure 11D:
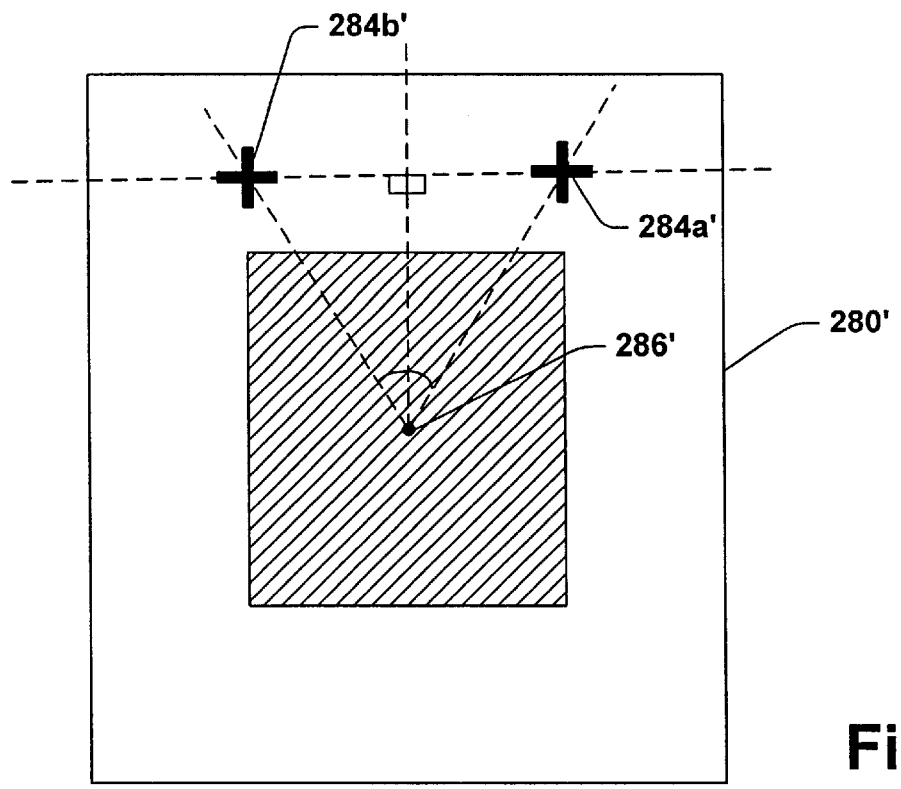
FIG. 11d is a schematic illustration of an still another alternative embodiment of a reticle with two symmetric alignment marks in accordance with the present invention.

FIG. 11c illustrates yet another embodiment of a reticle 280 wherein alignment marks 284a and 284b are symmetric to each other with respect to a reticle center 286, but wherein the reticle center 286 is not a midpoint of the alignment marks 284a and 284b. FIG. 11d illustrates still another embodiments of a reticle 280' wherein alignment marks 284a' and 284b' are symmetric to each other with respect to a reticle center 286', but wherein the reticle center 286' is not a midpoint of the alignment marks 284a' and 284b'.

Figure 11E:
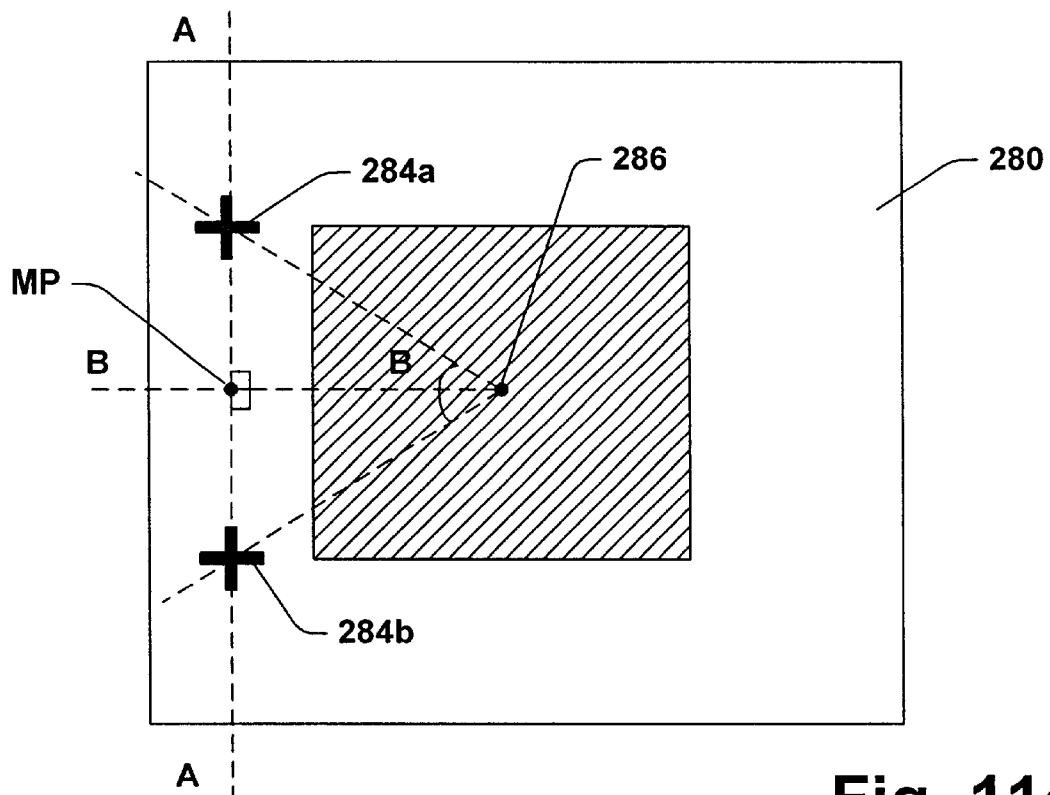
FIG. 11e illustrates the geometric relationship of the two alignment marks and reticle center of the reticle of FIG. 11a in accordance with the present invention.
Figure 11F:
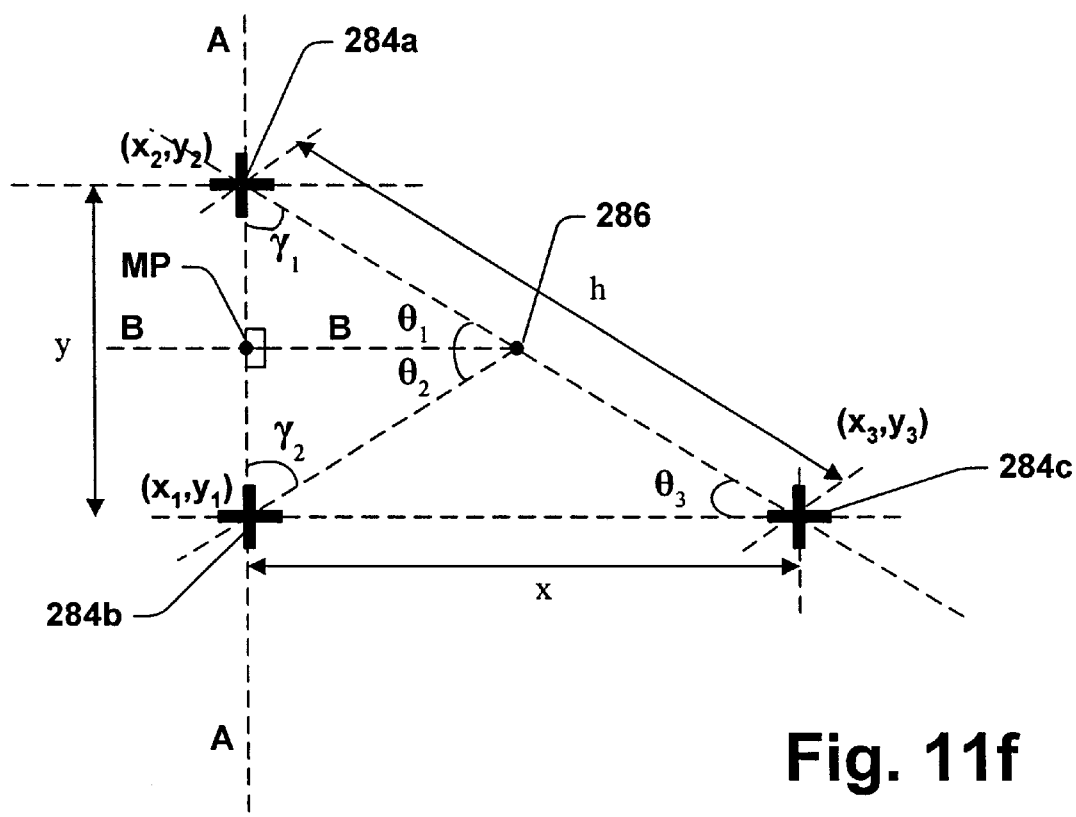
FIG. 11f illustrates the geometric relationship of the two alignment marks and reticle center of the reticle of FIG. 11e, which may be employed to determine the location of a phantom alignment mark in accordance with the present invention.

FIGS. 11e and 11f illustrate in greater detail the relationship of the alignment marks 284a and 284b of FIG. 11c. As shown in FIG. 11e, the marks 284a and 284b are symmetric to each other with respect to the reticle center 286. An imaginary line A crosses through the center of marks 284a and 284b, and an imaginary line B crosses through the reticle center 286 and a midpoint (MP) of the marks 284a and 284b—line A is perpendicular to line B.

FIG. 11f illustrates the geometric relationship between marks 284a, 284b and the reticle center 286. This relationship may be employed to derive a phantom mark location 284c with respect to the reticle 280. The reticle center 286 is a midpoint of the mark 284a and the phantom mark 284c. The alignment marks 284a and 284c are similar in arrangement to the marks 60 and 62, respectively, of FIG. 4. Thus, the processor 210 having determined the location of the phantom mark 284c could readily determine the location of a virtual mark location based on the marks 284a and 284b as printed on the wafer 100.

More particularly, due to the symmetric relationship of the marks 284a and 284b, the following relationships exists: angle ($\theta_1$)=angle ($\theta_2$)=angle ($\theta_3$), and angle ($\gamma_1$)=angle($\gamma_2$). The (x,y) coordinates for mark 284b are represented by ($x_1,y_1$) and the (x,y) coordinates for mark 284a are represented by ($x_2,y_2$) and the (x,y) coordinates for phantom mark 284c are represented by ($x_3,y_3$). It is to be appreciated that the coordinates for marks 284a and 284b are known by the processor 210 as well as the coordinates for the reticle center 286, and the processor employs these coordinates in determining the coordinates for phantom mark 284c. The following equations may be employed by the processor 210 to map the (x,y) coordinates for phantom mark 284c:

$$x_3 = h \cdot \cos(\theta_1) + x_1$$

$$y_3 = y_1$$

It is to be appreciated that a number of geometric relationships exist which the processor 210 may employ in determining the location of the phantom mark 284c, and the use of any and all such relationships is intended to fall within the scope of the present invention as defined by the hereto appended claims. The coordinates ($x_3$, $y_3$) and/or the geometric relationship between marks 284a and 284b may be employed by the processor 210 to map a virtual alignment mark in accordance with the present invention so as to facilitate wafer alignment and mitigate overlay error due to reticle rotation errors and/or lens magnification errors. Based on the above description, one skilled in the art could easily program the processor 210 of system 120 to determine a virtual alignment mark in accordance with this embodiment of the present invention.

Figure 12:
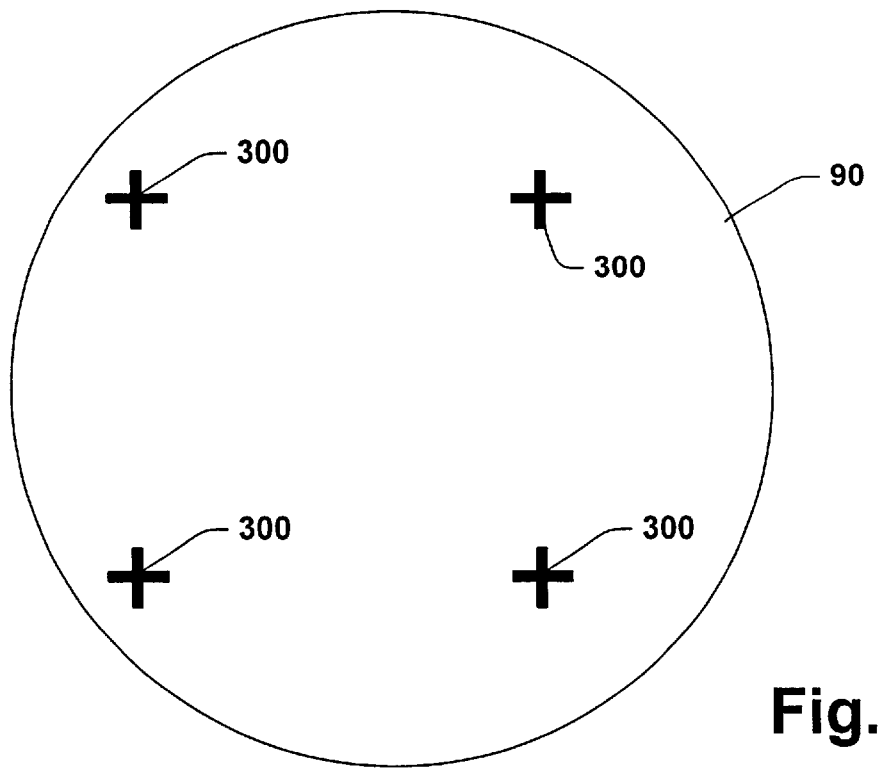
FIG. 12 is a schematic illustration of a wafer having the alignment marks of FIG. 4 printed one directly over the other under ideal conditions in accordance with the present invention.

FIG. 12 illustrates another embodiment of the present invention wherein instead of printing symmetric alignment marks 60 and 62 of a reticle 50 at a predetermined offset from the other, the marks are printed one mark over the other. The printed marks 300 on the wafer 90 illustrate an ideal case where each mark pair fits perfectly one on the other because there is no reticle error and/or magnification error.

Figure 13:
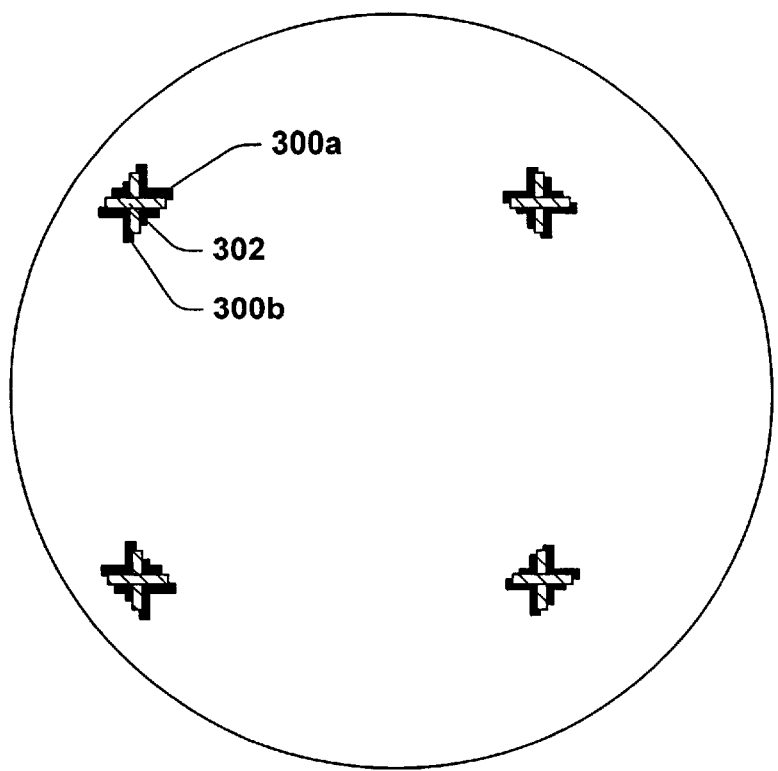
FIG. 13 is a schematic illustration of a wafer having alignment marks printed thereon wherein the alignment marks are not printed directly on one another due to reticle rotation in accordance with the present invention.

FIG. 13 illustrates the non-ideal case where a given mark pair does not print perfectly (one mark directly on the other mark). The hatched mark 302 indicates where the marks 60 and 62 should have printed, and the solid marks 300a and 300b indicate where the marks 60 and 62 actually printed, respectively.

Figure 14:
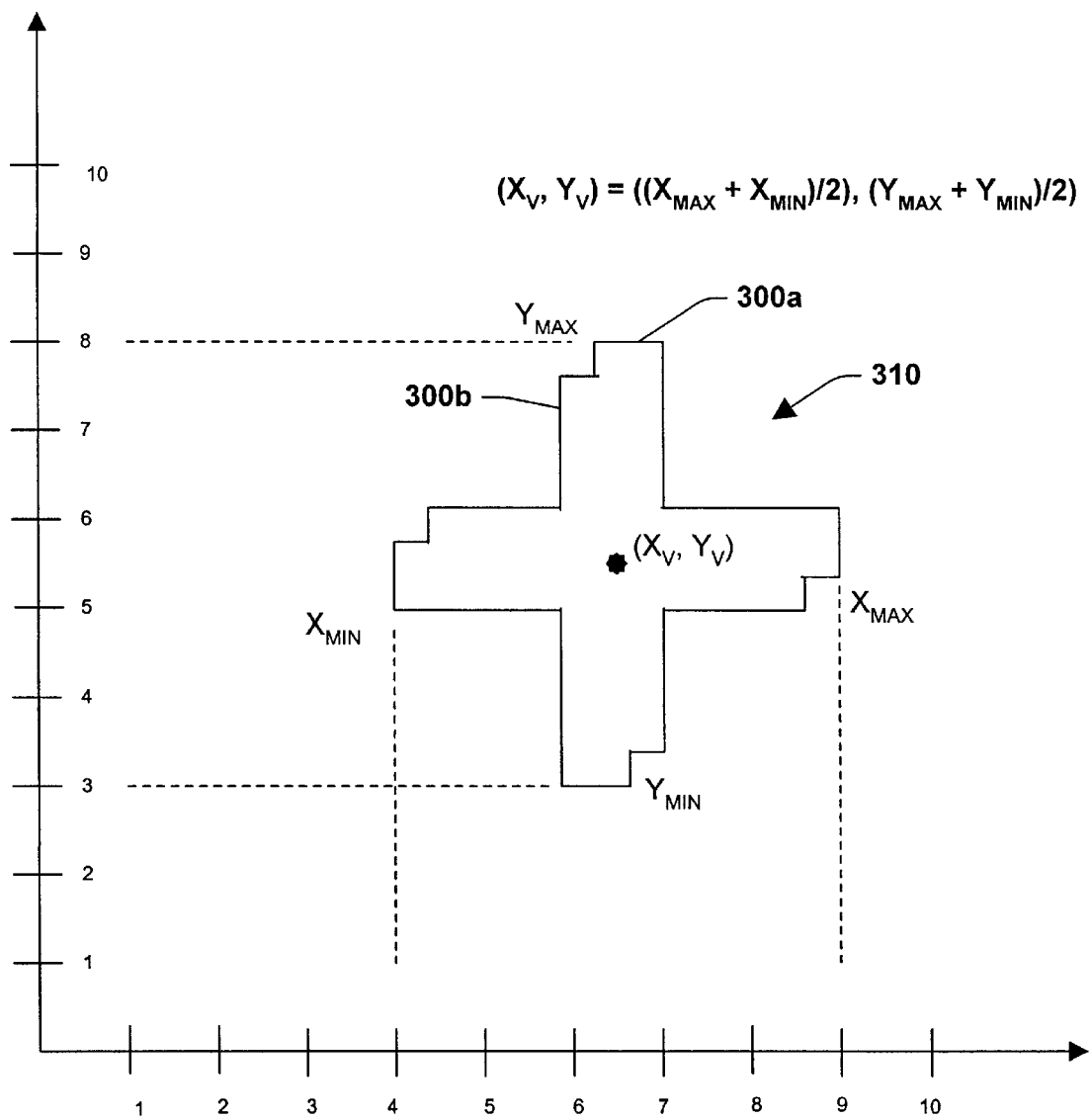
FIG. 14 is a schematic illustration of one pair of printed alignment marks of FIG. 13 mapped to a Cartesian coordinate system in accordance with the present invention.

FIG. 14 illustrates -the printed marks 300a and 300b of FIG. 13 mapped onto a Cartesian coordinate system. The marks 300a and 300b are treated as a single mark 310 from which a virtual alignment mark ($X_V,Y_V$) may be determined. The virtual alignment mark ($X_V,Y_V$) may be determined from the following equation:

$$(X_V, Y_V) = \left( \frac{(X_{MAX} + X_{MIN})}{2}, \frac{(Y_{MAX} + Y_{MIN})}{2} \right)$$

The virtual alignment mark ($X_V,Y_V$) may be used as described above to facilitate wafer alignment and mitigate overlay error due to reticle rotation and/or lens magnification. This particular embodiment provides additional advantages of preserving precious wafer realestate as well as speeding up the process of alignment since less measurements need to be made to determine the position of the two marks.

It is to be appreciated that any of the above embodiments may be applied to different surface layers (e.g., photoresist layers) employed in fabrication of a semiconductor device. Preferably, the alignment marks of one particular reticle will be printed at different locations (using a predetermined offset) so as to avoid overlapping of mark groups. By employing the predetermined offset, virtual alignment marks of respective layer groups may be cross-referenced for multi-layer alignment of device patterns so as to mitigate overlay errors due to reticle rotation errors and lens magnification errors. More particularly, for a first photoresist layer, first set of alignment marks (corresponding to a first reticle) are printed at a first predetermined region of a wafer. The teachings of the present invention are employed to determine a virtual alignment mark for wafer alignment. On a second and subsequent photoresist layer, a second set of alignment marks (corresponding to a second reticle) are printed at a second predetermined region of the wafer that is different from the first predetermined region. The offset of the second predetermined region with respect to the first predetermined region is known ahead of time. The known offset is employed to correlate a first virtual alignment mark corresponding to the first alignment mark set with a second virtual alignment mark corresponding to the second alignment mark set. As a result, reticle rotation errors of both the first and second reticles are negated as well as magnification errors negated during patterning of either layer, via employment of the first and second alignment marks. The first and second alignment marks are cross-referenced (taking into account the known offset) so as to align the first and second layers so as to mitigate overlay errors between the two layers due to reticle rotation errors and/or lens magnification/demagnification errors.

Since the virtual alignment marks afford for alignment of the wafer with respect to the respective reticle of each virtual alignment mark, reticle rotation errors and/or magnification errors are mitigated on a layer by layer basis, and on a multi-layer basis as well since overlay errors with respect to a given layer will not manifest in compounded overlay errors in subsequently formed layers as sometimes results conventionally.

Figure 15:
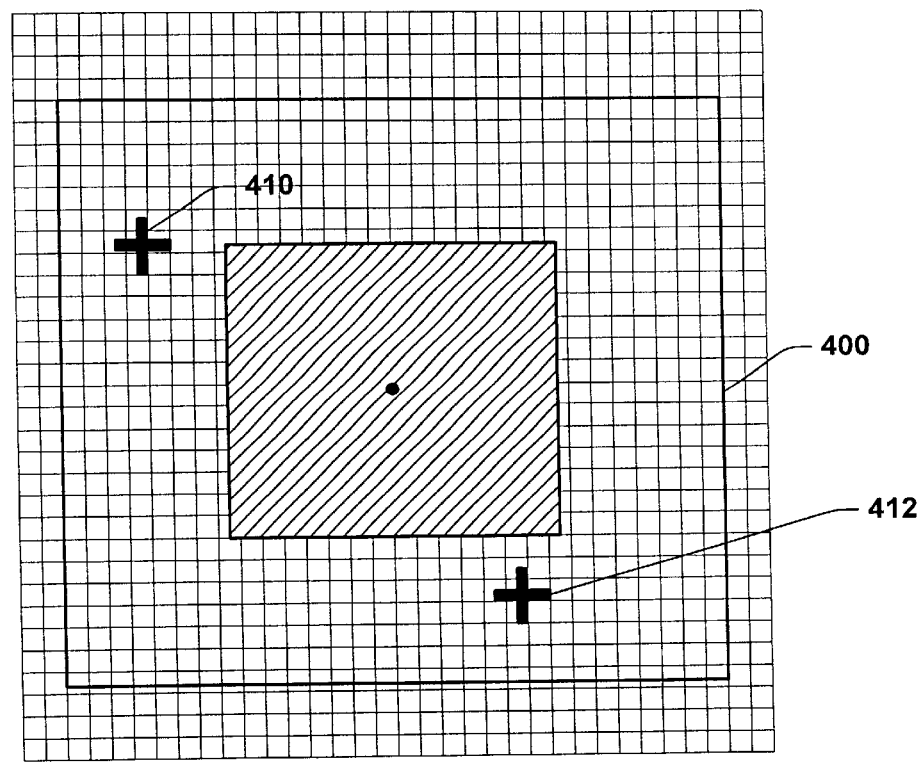
FIG. 15 is a schematic illustration of a reticle including two alignment marks, wherein the location of the alignment marks are mapped to a coordinate system with respect to the reticle in accordance with the present invention.
Figure 16:
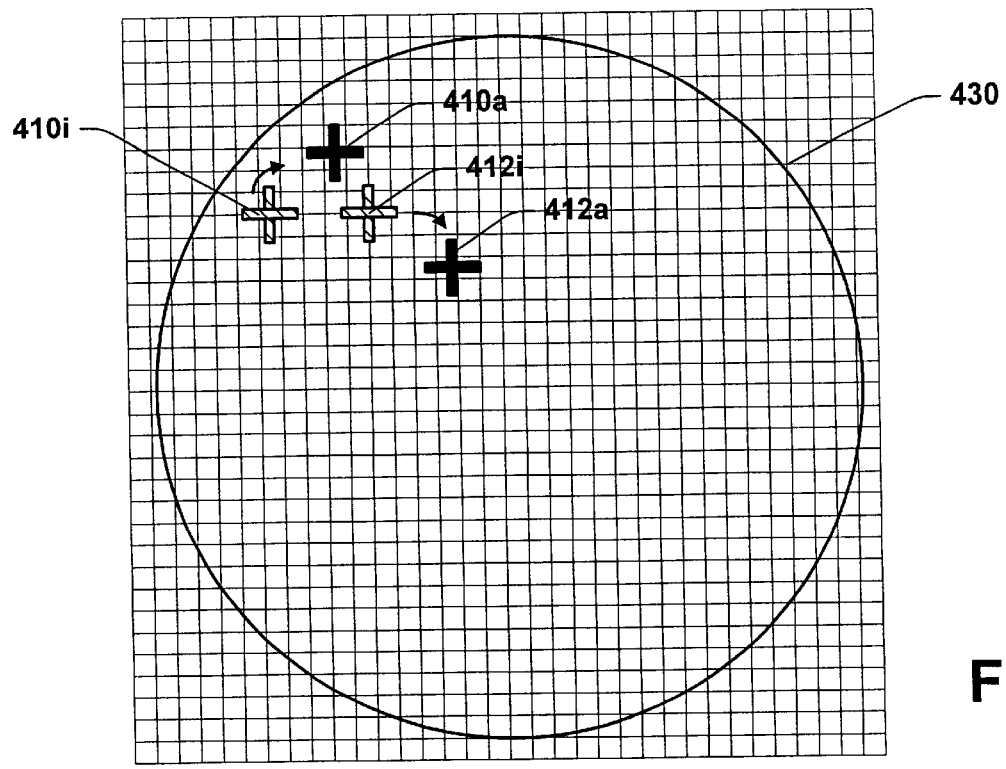
FIG. 16 is a schematic illustration of a wafer having intended print locations of the two alignment marks of FIG. 15 mapped to a coordinate system as well as actual print locations of the two alignment marks mapped to a coordinate system in accordance with the present invention.

FIGS. 15 and 16 illustrate another embodiment of the present invention, wherein a reticle 400 includes two alignment marks 410 and 412 (which may or may not be symmetric with respect to one another). The processor 210 maps the reticle 400 so as to define locations of the two alignment marks 410 and 412 with respect to the reticle 400. The processor 210 also maps a wafer 430 (FIG. 16) such that intended print locations for the two marks 410i and 412i are mapped as well as actual print locations of the marks 410a and 412a. The processor 210 can determine the deviation from intended print locations of the two marks and based on the correlation between the wafer mapping and reticle mapping determine the degree of reticle rotation and/or magnification error of a system employing the reticle 400 and the wafer 430. Once the type and magnitude of error(s) is determined, a processor can modify the system so as to compensate for the error(s) in order to mitigate overlay error due to reticle rotation and/or lens magnification.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system for aligning a wafer, comprising:
   a reticle, including:
      a design area;
      a first alignment mark; and
      a second alignment mark which is symmetric to the first alignment mark with respect to a reticle center point;
   at least one system for locating at least one of the first and second alignment marks as printed on the surface layer of the wafer; and
   a processor for controlling general operations of the system, the processor determining a first virtual alignment mark, the first virtual alignment mark being a midpoint of the first and second alignment marks as printed on the wafer, the processor employing the first virtual alignment mark to facilitate alignment of the wafer.

2. The system of claim 1, wherein a center point of the reticle is a midpoint of the first and second alignment marks.

3. The system of claim 1, the first alignment mark having an identical pattern as that of the second alignment mark.

4. The system of claim 1, the first alignment mark having a pattern different from the second alignment mark.

5. The system of claim 1, wherein at least on of the alignment marks is located outside the design area.

6. The system of claim 1, wherein a first imaginary line crosses the first and second alignment marks, and a second imaginary line crosses the reticle center point and a midpoint of the first and second alignment marks, the first imaginary line being perpendicular to the second imaginary line.

7. The system of claim 1, wherein the processor determines the location of the first virtual alignment mark with respect to the wafer based on the equation:

$$X_V, Y_V = \frac{X_1 + X_2}{2}, \frac{Y_1 + Y_2}{2}$$

wherein $X_V, Y_V$ are (x,y) coordinates for the first virtual alignment mark, and $(X_1, Y_1)$ are (x,y) coordinates for the first alignment mark as printed and $(X_2, Y_2)$ are (x,y) coordinates of the second alignment mark as printed.

8. The system of claim 1 wherein the processor determines the location of the first virtual alignment mark using a Least Squares methodology.

9. The system of claim 1, the processor determining a second virtual alignment mark of a second surface layer, the first virtual alignment mark having a known offset from the second virtual alignment mark with respect to the wafer.

10. The system of claim 9, the processor using the first virtual alignment mark and the second virtual alignment mark to align the first layer to the second layer.

11. The system of claim 10, the processor determining a third virtual alignment mark of a third surface layer, the second virtual alignment mark having a known offset from the third virtual alignment mark with respect to the wafer.

12. The system of claim 11, the processor using the second virtual alignment mark and the third virtual alignment mark to align the second layer to the third layer.

13. A system for aligning a wafer, comprising:
   a reticle, including:
      a design area;
      a first alignment mark; and
      a second alignment mark;
   at least one system for locating at least one of the first and second alignment marks as printed on the surface layer of the wafer; and
   a processor for controlling general operations of the system, the processor mapping the reticle so as to define locations of the first and second alignment marks with respect to the reticle, the processor also mapping the wafer so as to define intended locations of first and second alignment mark printing, and actual locations of first and second alignment mark as printed, the processor determining the magnitude of reticle rotation error and/or lens magnification error based on the alignment mark mappings.

14. A method for aligning a wafer, comprising the steps of:
   using a reticle, including:
      a design area;
      a first alignment; and
      a second alignment mark, the second alignment mark being symmetric to the first alignment mark with respect to a reticle center point;
   printing the first alignment mark on a first surface layer of the wafer;
   printing the second alignment mark on the first surface layer with an intent of printing the second alignment mark directly over the first alignment mark;
   determining a first virtual alignment mark, the first virtual alignment mark being a centroid of an object which represents the combined printed first and second alignment marks; and
   using the virtual alignment mark to facilitate aligning the wafer.

15. The method of claim 14, further including the step of determining a location of the virtual alignment mark from the following equation:

$$(X_V, Y_V) = \left(\frac{(X_{MAX} + X_{MIN})}{2}, \frac{(Y_{MAX} + Y_{MIN})}{2}\right)$$

wherein $(X_V, Y_V)$ are (x,y) coordinates of the virtual alignment mark, $X_{MAX}$ is a maximum x-coordinate of the object, $X_{MIN}$ is a minimum x-coordinate of the object, $Y_{MAX}$ is a maximum y-coordinate of the object, and $Y_{MIN}$ is a minimum y-coordinate of the object.

16. A system for aligning a wafer, comprising:
   means for printing at least two alignment marks on a surface layer of the wafer, the at least two alignment marks having an associated symmetry such the marks as printed substantially negate reticle rotation error and/or lens magnification error with respect to a midpoint of the marks as printed;
   means for determining the midpoint, the midpoint being a virtual alignment mark; and
   means for aligning the wafer using the virtual alignment mark as a reference.

17. The system of claim 16 further including means for identifying the location of the marks as printed.

18. The system of claim 16 further including means for determining virtual alignment marks for a plurality of layers.

19. The system of claim 18 further including means for aligning at least two of the plurality of layers employing respective virtual alignment marks as reference points.

20. A wafer alignment, comprising:

a reticle including at least two alignment marks;

means for printing the alignment: marks;

means for finding the printed alignment marks;

means for determining the deviation of the printed alignment marks from intended print locations; and means for modifying the wafer alignment system to compensate for the deviation.

* * * * *

UNITED STATES PATENT AND TRADEMARK OFFICE
CERTIFICATE OF CORRECTION

PATENT NO. : 6,269,322 B1
DATED : July 31, 2001
INVENTOR(S) : Michael K. Templeton et al.

It is certified that error appears in the above-identified patent and that said Letters Patent is hereby corrected as shown below:

Claim 5,
Line 1, please replace "at least on of" with -- at least one of --.

Claim 20,
Line 3, please replace "alignment: marks;" with -- alignment marks; --.

Signed and Sealed this

Twenty-ninth Day of January, 2002

Attest:

Attesting Officer

JAMES E. ROGAN
Director of the United States Patent and Trademark Office